(12) United States Patent
Zimmermann et al.

(10) Patent No.: US 6,271,557 B1
(45) Date of Patent: Aug. 7, 2001

(54) CENTER NODE FOR DEEP TRENCH CAPACITORS

(75) Inventors: Ulrich Zimmermann, Mechanicsville, VA (US); Thomas Achammer, Dornbirn (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/412,481

(22) Filed: Oct. 5, 1999

(51) Int. Cl.[7] .................................................. H01L 27/108
(52) U.S. Cl. ......................... 257/304; 257/301; 257/303; 257/532; 361/306.1
(58) Field of Search ..................................... 257/301, 303, 257/304, 532; 438/243, 386; 361/301.4, 306.1

(56) References Cited

U.S. PATENT DOCUMENTS

| | | | |
|---|---|---|---|
| 4,877,750 | * 10/1989 | Okumura | 438/387 |
| 4,905,065 | * 2/1990 | Selcuk et al. | 257/301 |
| 5,012,308 | * 4/1991 | Hieda | 257/301 |
| 5,066,609 | * 11/1991 | Yamamoto et al. | 438/246 |
| 5,168,336 | * 12/1992 | Mikoshiba | 257/303 |
| 5,354,701 | * 10/1994 | Chao | 438/244 |

OTHER PUBLICATIONS

N. C. C. Lu, Advanced Cell Structures for Dynamic RAMs, Jan. 1989, IEEE Circuits and Devices Magazine, pp. 27–36.*

* cited by examiner

*Primary Examiner*—Eddie Lee
*Assistant Examiner*—George C. Eckert, II
(74) *Attorney, Agent, or Firm*—Stanton C. Braden

(57) ABSTRACT

A trench capacitor cell, in accordance with the present invention, includes a trench having an outer electrode formed in a substrate adjacent to the trench. A storage node is formed in the trench and capacitively coupled to the outer electrode. A center node is capacitively coupled to the storage node, and the storage node surrounds the center node within the trench. The center node includes a portion extending from the trench for connecting to a potential to provide charge retention in the storage node during operation.

20 Claims, 4 Drawing Sheets

CENTER NODE FOR DEEP TRENCH CAPACITORS

BACKGROUND

1. Technical Field

This disclosure relates to semiconductor memories and more particularly, to trench capacitors having a center node to increase capacitive area and reduce charge leakage.

2. Description of the Related Art

Trench capacitor cells in dynamic random access memories (DRAMs) are commonly formed in a substrate. Trench capacitor cells include a trench having a storage node formed therein. The storage node acts as a first electrode to the trench capacitor. A buried plate is formed externally to the trench to form an outer plate of the trench capacitor, that is, the second electrode of the capacitor. The buried plate is formed by doping the silicon surrounding the etched trench which is then coated with a node dielectric and filled with a conductive material serving as the storage node or inner plate of the capacitor. The inner plate (or storage node) stores the signal charge and is connected to the drain of a transfer transistor switched by a wordline.

Referring to FIG. 1, the structure of a conventional trench capacitor is schematically shown. A bitline BL is connected to a source of a transfer transistor 12. A gate of transistor 12 is connected to a wordline WL. A drain of transistor is connected to a storage node 14 disposed withing a trench. A buried plate 16 is disposed in operative relationship to storage node 14 to form a trench capacitor. The trench capacitor is charged and discharged using bitline BL and wordline WL.

As smaller feature sizes are needed for future generations of trench capacitors, the conventional trench capacitors are pushed to the limits of their capabilities in terms of performance. One primary problem with DRAM designs using deep trench capacitor storage cells is maintaining a high capacity with decreasing feature size and keeping the charge in the deep trench from leaking out of the storage node. The conventional trench capacitors begin to lose capacitive area with smaller feature sizes and are susceptible to current leakage.

Therefore, a need exists for an improved trench capacitor for increasing capacitance and reducing current leakage therefrom.

SUMMARY OF THE INVENTION

A trench capacitor cell, in accordance with the present invention, includes a trench having an outer electrode formed in a substrate adjacent to the trench. A storage node is formed in the trench and capacitively coupled to the outer electrode. A center node is capacitively coupled to the storage node, and the storage node surrounds the center node within the trench. The center node includes a portion extending from the trench for connecting to a potential to provide charge retention in the storage node during operation.

In alternate embodiments, the trench capacitor cell preferably includes a transfer transistor coupled to the storage node for charging and discharging the trench capacitor. The portion of the center node extending from the trench may include a connection to a wordline, and the wordline may be an active wordline for the trench capacitor cell or a passing wordline. The center node to the storage node capacitance may be between about 0.5 fF to about 30 fF and preferably about 5fF, although other values may be employed depending on specific cell designs. The potential may be controlled by a control circuit coupled to the center node for adjusting the potential to maintain charge retention in the storage node, or the potential may be a constant potential. The control circuit may vary the potential to the center node in accordance with operations performed on the trench capacitor cell.

Another trench capacitor cell, in accordance with the present invention, includes a trench having an outer electrode formed in a substrate adjacent to the trench. A storage node is formed in the trench and is capacitively coupled to the outer electrode. The storage node is connected to a transfer transistor which enables the storage node to be charged and discharged. A center node is capacitively coupled to the storage node, and the storage node surrounds the center node within the trench. The center node includes a portion which connects to a gate of the transfer transistor to provide charge retention in the storage node during operation.

A bitline is preferably coupled to the transfer transistor for charging and discharging the trench capacitor. The gate of the transfer transistor may include a wordline. The wordline may be an active wordline for the trench capacitor cell. The center node to the storage node capacitance may be between about 0.5 fF to about 30fF, and preferably about 5fF.

Another trench capacitor cell, in accordance with the present invention, includes a trench having an outer electrode formed in a substrate adjacent to the trench. A storage node is formed in the trench and capacitively coupled to the outer electrode. The storage node is connected to a transfer transistor which enables the storage node to be charged and discharged. A center node is capacitively coupled to the storage node, and the storage node surrounds the center node within the trench. The center node includes a portion connecting to a passing wordline to provide charge retention in the storage node during operation.

In alternate embodiments, the transfer transistor may include a gate connected to an active wordline, and the active wordline and the passive wordline may be activated concurrently. The concurrent activation of the active wordline and the passive wordline may be provided by disposing one bitline of each bitline pair on opposite sides of a sense amplifier such that the pair of bitlines are not adjacently disposed.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides a method and structure for increasing the trench capacity by introducing an additional capacitor plate. The cell size may be maintained or reduced while reducing the degradation of stored charge. Advantageously, the stored voltage in the retention pause may be reduced be employing the present invention.

The present invention utilizes an inner plate more efficiently by separating the inner plate into a storage node and an additional plate or center node. The center node is provided by first depositing an inner plate of reduced thickness that will not fill the deep trench entirely. Then, a second node dielectric is formed and conducting material is deposited for the center node.

Figure 1:
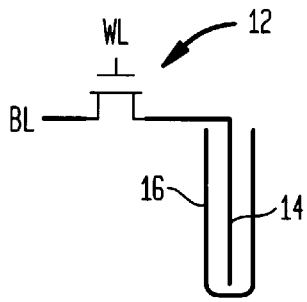
FIG. 1 is a schematic diagram of a conventional deep trench capacitor cell.
Figure 2A:
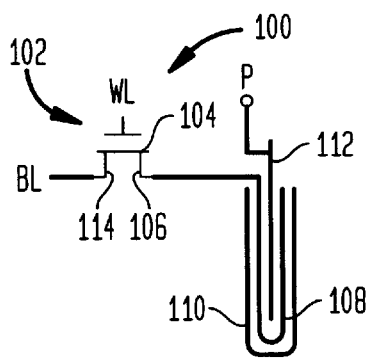
FIG. 2A is a schematic diagram of a deep trench capacitor cell in accordance with the present invention.

Referring now in specific detail to the drawings in which like reference numerals identify similar or identical elements throughout the several views, and initially to FIG. 2A, a capacitor cell 100 is schematically shown in accordance with the present invention. A bitline BL is connected to a source 114 of a transfer transistor 102. A gate 104 of transistor 102 is connected to a wordline WL. A drain 106 of transistor is connected to a storage node 108 disposed within a trench. A buried plate (or outer electrode) 110 is disposed in operative relationship to storage node 108 to form a trench capacitor. The trench capacitor is charged and discharged by employing bitline BL and wordline WL as is known in the art.

In accordance with the present invention, a center node 112 is formed within storage node 108. Center node 112 and storage node 108 are capacitively coupled, as are buried plate 110 and storage node 108. There are several ways to utilize center node 112. As shown in FIG. 2A, center node 112 is employed to increase the capacitance of the whole storage node by connecting the center node to a fixed potential P. The capacitances of the two capacitors (i.e., buried plate/storage node and storage node/center node) with a common plate (i.e., storage node) would simply have their capacitances added.

Figure 2B:
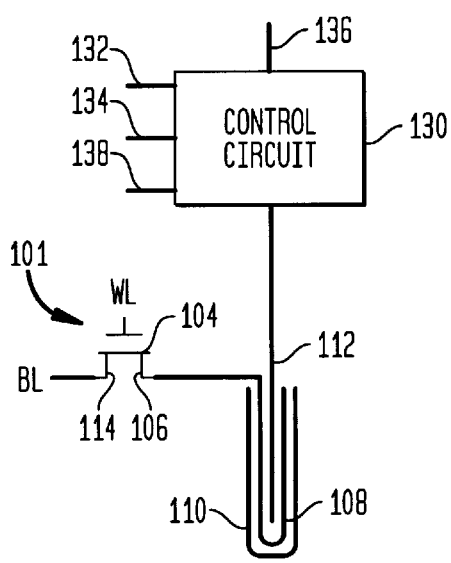
FIG. 2B is a schematic diagram of another embodiment of the deep trench capacitor cell of FIG. 2A in accordance with the present invention.

Referring to FIG. 2B, an alternate approach includes providing a control circuit 130 which may provide connections to one or more of on-chip clocks 132, sense amplifiers 134, bitlines and/or wordlines 136 and/or logic circuits 138. In this way, the potential applied to center node 112 may be adjusted to optimize retention during read and write and refresh cycles during operation. Control circuit 130 may include one or more transistors which actively switch the potential applied to center node 112 during different operations of the device. Alternately, control circuit 130 may include a connection to an existing circuit component or voltage source.

Figure 3:
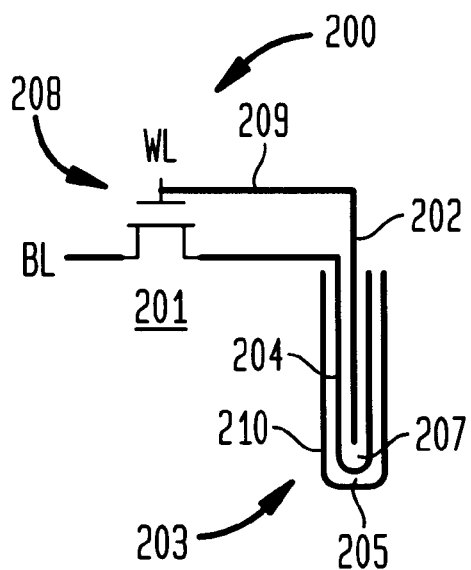
FIG. 3 is a schematic diagram of a deep trench capacitor cell showing a center node connected to a wordline in accordance with the present invention.

Referring to FIG. 3, a schematic diagram of another embodiment of the present invention is shown. In accordance with the present invention, many benefits may be realized by connecting a center node 202 to a variable potential which permits a temporary decrease of a storage node voltage associated with a stored "1" during a retention pause. A retention pause is a delay between writing data in the form of voltage or charge transfer to the storage cell and reading this data back from the cell. In one embodiment, a potential that is readily available even in a dense array layout is an active wordline WL for a trench capacitor cell 200 as shown. Other potentials may be applied to center node 202 and are contemplated by the present invention. An inner electrode (or storage node) 204 is coupled to a transfer transistor 208 as described above to connect bitline BL thereto when transistor 208 is activated by wordline WL. An outer electrode (or buried plate) 210 is operatively positioned relative to inner electrode 204. Outer electrode 210 is formed in a substrate 201 by doping substrate 201 adjacent to a trench 203. A dielectric layer 205 (node dielectric) is formed on trench sidewalls, and a conductive layer, such as polysilicon or a metal, is deposited to form inner electrode (storage node) 204. Another dielectric layer 207 is formed over storage node 204 followed by center node 202 formation. Center node 202 may also include a metal or polysilicon. Center node 202 preferably extends from trench 203 to connect to a wordline at connections 209.

Figure 4:
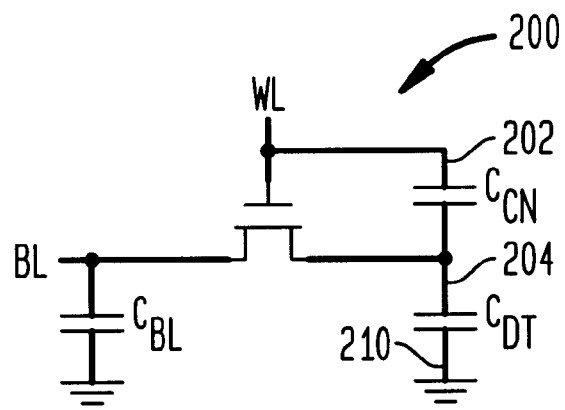
FIG. 4 is a schematic diagram of an equivalent circuit of the deep trench capacitor cell of FIG. 3 in accordance with the present invention.

Referring to FIG. 4 with continued reference to FIG. 3, a capacitance formed between center node 202 and inner electrode 204 is labeled $C_{CN}$. A capacitance formed between inner electrode 204 and outer electrode 210 is labeled $C_{DT}$, and a bitline (BL) capacitance is labeled $C_{BL}$. In operation, wordline WL and thus inner electrode 204 will be at high potential (VPP) while writing to or reading from cell 200. The resulting capacitance will be an enhanced capacitance given by $C_{CN}+C_{DT}$.

During a retention pause wordline WL is "bumped" to low potential (VSS). Consequently, the voltage of inner electrode 204 (which is the actual storage node for the signal charge in the cell) will be reduced. Reducing the voltage on storage node (inner electrode) 204 for a "1" ("high") during the retention pause will significantly increase retention of the cell since most leakage mechanisms depend very strongly on the voltage difference between the storage node and adjacent areas.

When holding a "0" ("low") voltage on storage node 204, the potential of storage node 204 may fall below the potential with which it was written. This may lead to the degradation of the "0". However, potentials of the electrodes and a ratio of $C_{DT}$ and $C_{CN}$ can be adjusted and optimized so that the gain in retention for the "1" outweighs the loss due to degradation of the "0" (retention problems in DRAMs are primarily associated with a degradation of the "1" while the "0" is usually not critical).

Figure 5:
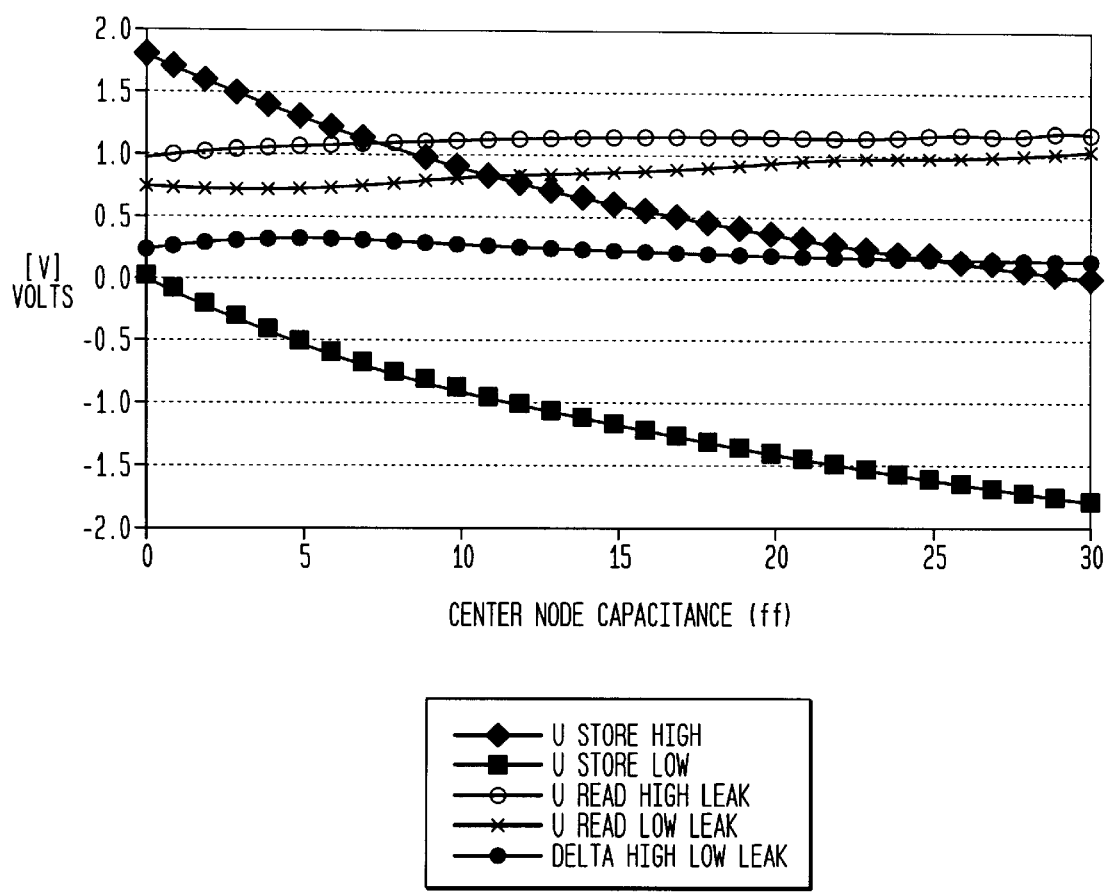
FIG. 5 is an illustrative plot of voltage on a storage node versus center node capacitance relative to the storage node in accordance with the present invention.

Referring to FIG. 5, an illustrative plot is shown for voltage levels of "0" (U_store_low) and "1" (U_store_high) during storage, the voltages of "0" (U_read_low_leak) and "1"(U_read_high_leak) on a bitline BL after a read has been performed, and the difference between U_read_low_leak and U_read_high_leak (Delta_high_low_leak), all as a function of the center node capacitance, $C_{CN}$, (x-coordinate).The plot of FIG. 5 is performed for the structure shown in FIGS. 3 and 4.

In FIG. 5, the following illustrative values were utilized:

$C_{DT}$=30fF; $C_{BL}$=150fF; VSS=0; VPP=3.6V;

The voltage written as "1" (high) was 1.8V and the voltage written as "0" (low) was 0V. The bitline potential before a read was 0.9V.

For simplicity, it was also assumed that the "0" degraded to −0.5V and the "1" to 1.4V for long retention times due to various leakage mechanisms. These values are illustrative only and can of course, may be different in different embodiments or designs.

Of particular note in FIG. 5 is Delta_high_low_leak. This parameter shows a voltage difference on the bitlines BL between reading a "0" and a "1". Illustratively, at a $C_{CN}$ of about 5fF, this voltage difference has a maximum around 350 mV, a value about 50% higher than that achieved with the conventional cell design of 250 mV (where $C_{cn}=0$). Assuming a minimum voltage difference of 200 mV to be able to sense the signal on the bitline at all, this constitutes an improvement in sense margin by a factor of about 3, for example. The sense margin is the margin the signal sensing circuitry has before noise or other interference will lead to incorrect sensing of the signal. Keeping this signal margin sufficiently high is a difficult task in shrinking feature sizes of DRAMs. The margin can be increased by larger cell capacitance and less cell leakage, the topic addressed by the present invention. Further optimization may be employed to achieve an even higher sense margin in accordance with the present invention.

Creating an additional small capacitor, preferably between about 0.5 fF to about 30 fF and more preferably about 5 fF to about 10 fF (other capacitances may be employed as well), with the center node only adds a limited amount of capacitance to the wordline WL (the length and/or driver strength of the WL may have to be adjusted slightly to accommodate this). Further, in accordance with the present invention, wordline voltages may be varied between read and write cycles to further improve cell performance.

Figure 6:
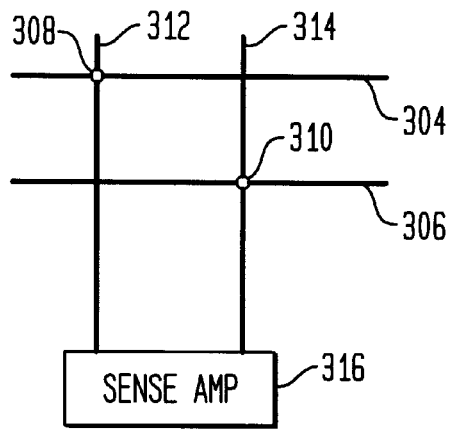
FIG. 6 depicts a conventional layout showing an bitline pairs connected on a same side of a sense amplifier.

Referring to FIG. 6, a conventional "folded bitline" architecture is shown. Here, a pair of bitlines 312 and 314 from which the sense amplifier 316 senses a voltage difference caused by reading a cell 308 (or 310) are located next to each other on the same side of the sense amplifier 316. With this layout, commonly only one wordline 304 or 306 intersecting the bitlines 312 and 314, respectively, can be activated at once since each wordline reads a separate cell on the same bitline pair.

Figure 7:
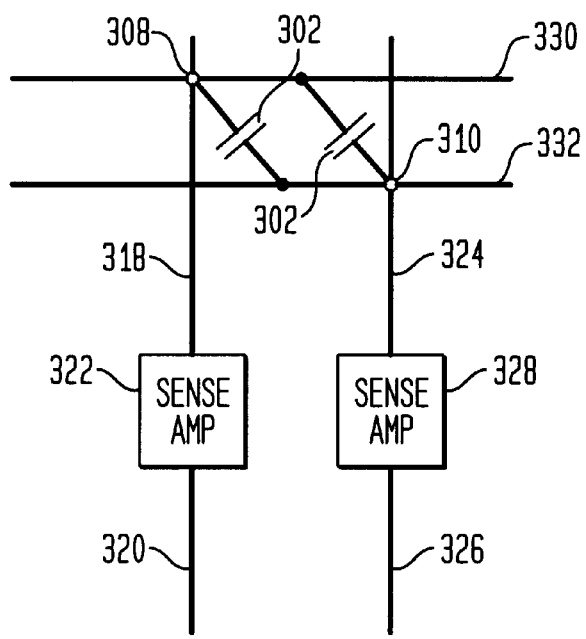
FIG. 7 depicts a layout showing an implementation of the present invention by employing a bitlines on opposite side of a sense amplifier.

Referring to FIG. 7, an arrangement is shown in accordance with the present invention where two bitlines 318 and 320 of a bitline pair are located on different sides of a sense amplifier 322. Neighboring bitlines (e.g., 324 and 326) then belong to separate sense amplifiers (bitlines 324 and 326 "belong" to sense amplifier 328) and two neighboring wordlines 330 and 332 may be activated at once. Center nodes 302 (shown as a capacitor) are connected to passing wordlines 330 and 332 for cells 308 and 310, respectively. Two neighboring wordlines (active and passive wordlines for a given cell) could then be activated simultaneously to read from two cells 308 and 310. The present invention splits a storage node of trench capacitor cells into a storage node and a center node to enhance overall cell capacitance. This center node can be connected to the active wordline of the cell. This leads to a reduction of the storage node voltage of the "1" during the retention pause when the WL is low, thus reducing signal degradation. An optimum capacitance for the center node can be found when the loss in signal for the "0" is compensated with the gain in signal for the more retention-critical "1" with an overall benefit regarding total signal margin. Although described in terms of a DRAM trench capacitor, the present invention is broader. For example, the present invention may be employed in other memory cells or other semiconductor devices employing a trench capacitor. The center node was shown connected with wordlines however other signal carrying members may be employed in accordance with the present invention.

Having described preferred embodiments for center node for deep trench capacitors (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed arid desired protected by Letters Patent is set forth in the appended claims.

What is claimed is:

1. A trench capacitor cell comprising:
   a trench having an outer electrode formed in a substrate adjacent to the trench;
   a storage node formed in the trench and capacitively coupled to the outer electrode;
   a transfer transistor coupled to the storage node for charging and discharging the trench capacitor;
   a center node capacitively coupled to the storage node, the storage node surrounding the center node within the trench, the center node including a portion extending from the trench for connecting to a potential to provide charge retention in the storage node during operation.

2. The trench capacitor cell as recited in claim 1, wherein the potential is a constant potential.

3. The trench capacitor cell as recited in claim 1, wherein the portion extending from the trench includes a connection to a wordline.

4. The trench capacitor cell as recited in claim 3, wherein the wordline is an active wordline for the trench capacitor cell.

5. The trench capacitor cell as recited in claim 3, wherein the wordline is a passing wordline.

6. The trench capacitor cell as recited in claim 1, wherein the center node to the storage node capacitance is between about 0.5 fF to about 30 fF.

7. The trench capacitor cell as recited in claim 1, wherein the center node to the storage node capacitance is about 5 fF.

8. The trench capacitor cell as recited in claim 1, wherein the potential is controlled by a control circuit coupled to the center node for adjusting the potential to maintain charge retention in the storage node.

9. The trench capacitor cell as recited in claim 8, wherein the control circuit varies the potential to the center node in accordance with operations performed on the trench capacitor cell.

10. A trench capacitor cell comprising:
    a trench having an outer electrode formed in a substrate adjacent to the trench;
    a storage node formed in the trench and capacitively coupled to the outer electrode, the storage node being connected to a transfer transistor which enables the storage node to be charged and discharged; and
    a center node capacitively coupled to the storage node, the storage node surrounding the center node within the trench, the center node including a portion connecting to a gate of the transfer transistor to provide charge retention in the storage node during operation.

11. The trench capacitor cell as recited in claim 10, further comprising a bitline coupled to the transfer transistor for charging and discharging the trench capacitor.

12. The trench capacitor cell as recited in claim 10, wherein the gate of the transfer transistor includes a wordline.

13. The trench capacitor cell as recited in claim 12, wherein the wordline is an active wordline for the trench capacitor cell.

14. The trench capacitor cell as recited in claim 10, wherein the center node to the storage node capacitance is between about 0.5 fF to about 30 fF.

15. The trench capacitor cell as recited in claim 10, wherein the center node to the storage node capacitance is about 5fF.

16. A trench capacitor cell comprising:

a trench having an outer electrode formed in a substrate adjacent to the trench;

a storage node formed in the trench and capacitively coupled to the outer electrode, the storage node being connected to a transfer transistor which enables the storage node to be charged and discharged; and a center node capacitively coupled to the storage node, the storage node surrounding the center node within the trench, the center node including a portion connecting to a passing wordline to provide charge retention in the storage node during operation.

17. The trench capacitor cell as recited in claim 16, wherein the transfer transistor includes a gate connected to an active wordline.

18. The trench capacitor cell as recited in claim 17, wherein the active wordline and the passing wordline are activated concurrently.

19. The trench capacitor cell as recited in claim 18, wherein the concurrent activation of the active wordline and the passing wordline is provided by disposing one bitline of each bitline pair on opposite sides of a sense amplifier such that the pair of bitlines are other than adjacently disposed.

20. A trench capacitor cell comprising:

a trench having an outer electrode formed in a substrate adjacent to the trench;

a storage node formed in the trench and capacitively coupled to the outer electrode;

a center node capacitively coupled to the storage node, the storage node surrounding the center node within the trench, the center node including a portion extending from the trench for connecting to a potential to provide charge retention in the storage node during operation, wherein the potential is a constant potential.

* * * * *